United States Patent

Ciubotaru et al.

(10) Patent No.: US 12,125,623 B2
(45) Date of Patent: Oct. 22, 2024

(54) LOGIC GATES BASED ON PHASE SHIFTERS

(71) Applicant: IMEC VZW, Leuven (BE)

(72) Inventors: Florin Ciubotaru, Heverlee (BE); Hanns Christoph Adelmann, Wilsele (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/804,550

(22) Filed: May 27, 2022

(65) Prior Publication Data

US 2022/0392683 A1 Dec. 8, 2022

(30) Foreign Application Priority Data

Jun. 4, 2021 (EP) .................................... 21177763

(51) Int. Cl.
*H01F 10/32* (2006.01)
*H01P 1/18* (2006.01)
*H03K 19/21* (2006.01)

(52) U.S. Cl.
CPC .............. *H01F 10/32* (2013.01); *H01P 1/18* (2013.01); *H03K 19/21* (2013.01)

(58) Field of Classification Search
CPC ............ H01F 10/32; H01P 1/18; H03K 19/21
See application file for complete search history.

(56) References Cited

U.S. PATENT DOCUMENTS

| 9,361,963 B2* | 6/2016 | Manzke | G11C 11/14 |
| 10,439,616 B2* | 10/2019 | Zografos | G06F 1/04 |
| 2013/0083595 A1* | 4/2013 | Nakamura | G11C 11/161 |
| | | | 365/171 |
| 2013/0147579 A1* | 6/2013 | Ito | G11C 11/16 |
| | | | 333/147 |
| 2020/0051725 A1* | 2/2020 | Xiao | H10N 50/80 |
| 2020/0110433 A1* | 4/2020 | Adelmann | G06E 1/045 |

OTHER PUBLICATIONS

Extended European Search Report dated Nov. 30, 2022 in European Application No. 21177763.6.
Dutta et al., "Non-volatile Clocked Spin Wave Interconnect for Beyond-CMOS Nanomagnet Pipelines", *Scientific Reports*, 5, Art. No. 9861 (May 2015); 9 pages; DOI: 10.1038/srep09861.
(Continued)

*Primary Examiner* — Kurtis R Bahr
(74) *Attorney, Agent, or Firm* — Knobbe, Martens, Olson & Bear LLP

(57) ABSTRACT

The disclosed technology relates to a logic device based on spin waves. In one aspect, the logic device includes a spin wave generator, a waveguide, at least two phase shifters, and an output port. The spin wave generator is connected with the waveguide and is configured to emit a spin wave in the waveguide. The at least two phase shifters are connected with the waveguide at separate positions such that, when a spin wave is emitted by the spin wave generator, it passes via the phase shifters. The at least two phase shifters are configured to change a phase of the passing spin wave. The output port is connected with the wave guide such that the at least two phase shifters are present between the spin wave generator and the output port.

16 Claims, 3 Drawing Sheets

(56) References Cited

OTHER PUBLICATIONS

Talmelli et al., "Reconfigurable submicrometer spin-wave majority gate with electrical transducers", *Sci. Adv.*, 6, Art. No. eabb4042, published Dec. 18, 2020; 10 pages.
Schneider et al., "Realization of XNOR and NAND spin-wave logic gates", Cornell University, submitted Nov. 29, 2007, arXiv:0711.4720; 5 pages.
Zhang et al., "Bias-free reconfigurable magnonic phase shifter based on a spin-current controlled ferromagnetic resonator", *J. Phys. D.: Appl. Phys.*, 53, Art. No. 105002, published Dec. 23, 2019; 11 pages.
Lan et al., Antiferromagnetic Domain Wall as Spin Wave Polarizer and Retarder. Nature Communications 8, 178 (Aug. 2017), pp. 1-7.

\* cited by examiner

LOGIC GATES BASED ON PHASE SHIFTERS

CROSS-REFERENCE TO RELATED APPLICATIONS

This application claims foreign priority to European Patent Application No. 21177763.6, filed Jun. 4, 2021, the content of which is incorporated herein by reference in its entirety.

BACKGROUND

Technological Field

The disclosed technology relates to the field of computation devices. More specifically, the disclosed technology relates to computation devices based on spin waves.

Description of the Related Technology

Spintronic devices based on spin waves are promising alternatives to CMOS technology with high potential for power and area reduction per computing throughput. The information can be encoded in either the amplitude or the phase of spin waves, while logic operation is based on their interference. Hence, such devices use information carrier other than electrons/charge, which in CMOS are used as information carrier.

Some wave-based logic technologies utilize a majority gate. In such devices, a plurality of waves interfere, and the interference result is the majority of the initial waves. For example, the interference of two waves with phase "0" and one wave with phase "pi" will result in a wave with phase "0", which corresponds with the majority of the initial waves. Other concepts include using non-Boolean algebra and analog circuits for neuromorphic applications.

In logic devices based on (spin-) wave interference, the amplitude level at the output depends strongly on the interference (constructive or destructive) mechanism as well as on the number of the input waves that are interfering (see, for example, spin wave majority gates). Therefore, additional elements may be required to normalize the output of one logic gate to serve as input for the next gate.

One of the drawbacks of such a device is that the sources should be powered by RF signals. These are signals in the GHz regime. Each input should have a very well-defined phase in order to obtain constructive or destructive interference. The operation of logic gates in pulsed regime may require complex clocking schemes to take into account the (time/space) dispersion of the propagating pulses generated at the inputs, and to achieve thus a correct interference process at the output port. The design of the logic gates is strongly dependent on the wavelength of the (spin) waves.

U.S. Pat. No. 10,439,616 discloses an example of a wave-based majority gate device which includes an odd number of spin wave generators and at least one spin wave detector, where interference of the spin waves generated by the spin wave generators can be detected by the at least one spin wave detector.

There is a need for alternative configurations for logic devices based on spin waves. For example, alternative devices may be less complex in terms of output normalization and/or in terms of phase synchronization.

SUMMARY OF CERTAIN INVENTIVE ASPECTS

One objective of embodiments of the disclosed technology is to provide a good logic device based on spin waves and a spintronic circuit including such a logic device.

This objective and others are accomplished by a method and device according to the disclosed technology.

In a first aspect, embodiments of the disclosed technology relate to a logic device based on spin waves.

In some embodiments, the logic device includes a spin wave generator, a waveguide, at least two phase shifters, and an output port.

In some embodiments, the spin wave generator is connected with the waveguide and is configured to emit a spin wave in the waveguide.

In some embodiments, the at least two phase shifters are connected with the waveguide at separate positions such that, when a spin wave is emitted by the spin wave generator, it passes via the phase shifters, where the at least two phase shifters are configured to change a phase of the passing spin wave.

In some embodiments, the output port is connected with the wave guide such that the at least two phase shifters are present between the spin wave generator and the output port.

It is an advantage of embodiments of the disclosed technology that a logic device can be obtained which includes only one spin wave generator. Thus, only one RF signal needs to be generated.

This contrasts with interference-based logic gates where different input waves are generated and may or may not interfere. In such logic gates, multiple RF sources may be required.

The operation of such logic gates in pulsed regime may require complex clocking schemes to take into account the (time/space) dispersion of the propagating pulses generated at the inputs, and to thus achieve a correct interference process at the output port.

It is an advantage of embodiments of the disclosed technology that the amplitude of the spin waves will remain nearly unchanged when passing via the phase shifters. This allows cascading of the logic devices without the need of additional elements for signal normalization. Logic gates which are based on interference, on the other hand, may require additional elements to normalize the output of one logic gate to serve as input for the next gate.

In some embodiments of the disclosed technology, the waveguide may be a straight magnetic waveguide, also referred to as an inline waveguide.

In a second aspect, embodiments of the disclosed technology relate to a spintronic circuit including at least two logic devices, of which at least one is a logic device according to embodiments of the disclosed technology, where an output at the output port of one logic device may be combined with an output at the output port of another logic device, or where one logic device may be used as spin wave generator for the other logic device.

It is an advantage of embodiments of the disclosed technology that the outputs of logic devices can be combined or that cascading of logic devices can be achieved without the need for normalizing the amplitudes of the outputs of the logic devices. The cascading scheme may be achieved by allowing the spin wave to propagate in the waveguide for the next logic operations. The corrections for the phase accumulation may be achieved by the device design (adjustments of the propagation lengths and distances between DC inputs).

A spintronic circuit according to some embodiments of the disclosed technology may include at least one logic device based on spin wave interference, which is interconnected with at least one logic device according to embodiments of the disclosed technology.

In a third aspect, embodiments of the disclosed technology relate to a toolbox for creating a spintronic circuit, the toolbox including at least a building block for creating a logic device according to embodiments of the disclosed technology.

Particular and exemplary aspects of the disclosed technology are set out in the accompanying independent and dependent claims. Features from the dependent claims may be combined with features of the independent claims and with features of other dependent claims as appropriate and not merely as explicitly set out in the claims.

These and other aspects of the disclosed technology will be apparent from and elucidated with reference to the embodiments described hereinafter.

Figure 1:
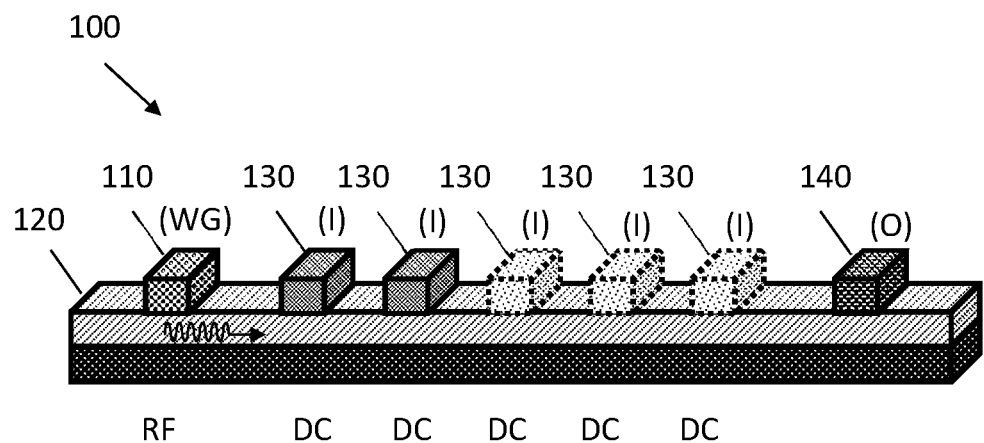
FIG. 1 shows a schematic drawing of a logic device in accordance with embodiments of the disclosed technology.

Any reference signs in the claims shall not be construed as limiting the scope.

In the different drawings, the same reference signs refer to the same or analogous elements.

Detailed Description of Certain Illustrative Embodiments

The disclosed technology will be described with respect to particular embodiments and with reference to certain drawings but the disclosed technology is not limited thereto. The drawings described are only schematic and are non-limiting. In the drawings, the size of some of the elements may be exaggerated and not drawn on scale for illustrative purposes.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

The term "comprising" in the claims should not be interpreted as being restricted to the features, integers, steps, or components listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of certain embodiments of the disclosed technology, various features of the disclosed technology are sometimes grouped together in a single embodiment, figure, or description thereof for the purpose of streamlining the disclosure and aiding in the understanding of one or more of the various aspects of the disclosed technology. This method of disclosure, however, is not to be interpreted as reflecting an intention that the disclosed technology requires more features than are expressly recited in each claim. Rather, as the following claims reflect, aspects of the disclosed technology lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In some instances, certain methods, structures and techniques have not been shown in detail in order not to obscure an understanding of this description.

In a first aspect, embodiments of the disclosed technology relate to logic device 100 based on spin waves. A schematic drawing illustrating an exemplary embodiment of such a logic device is illustrated in FIG. 1. A logic device 100, according to embodiments of the disclosed technology, includes a spin wave generator 110, a waveguide 120, at least two phase shifters 130, and an output port 140.

In some embodiments of the disclosed technology, the spin wave generator 110 is connected with the waveguide 120 and is configured to emit a spin wave in the waveguide 120.

The at least two phase shifters 130 are connected with the waveguide 120 at separate positions such that, when a spin wave is emitted by the spin wave generator 110, it passes via the phase shifters 130. The at least two phase shifters 130 are configured to change a phase of the passing spin wave. Therefore the phase shifters include an input port. The phase shift is depending on the input signal on the input port. For example, phase shifts of 0° and 1800 may be obtained.

The output port 140 is connected with the waveguide such that the at least two phase shifters 130 are present between the spin wave generator and the output port 140.

The spin wave generator 110 (WG) may, for example, be a transducer based on inductive antennas, spin-transfer-torque, spin-orbit-torque, spin-Hall effect, voltage controlled magnetic anisotropy, magnetoelectric effect. The spin wave generator 120 may, for example, be a magneto-electric cell configured to generate a spin wave by a spin torque effect. The spin wave generator may, for example, be a magnetic tunnel junction configured to generate a spin wave by a spin torque effect.

The scheme for the logic operation may be as follows. The spin wave generator 110 emits a spin wave which propagates in the magnetic conduit. By applying a DC voltage to a port (I) (considered as logic inputs) of a phase shifter 130, the internal magnetic field in the waveguide is modified. Consequently, the spin wave that propagates through this landscape of modified internal field will change its phase with a certain (controllable) amount. In some embodiments of the disclosed technology, the phase shift takes place when the wave is passing through the shifter both in space (physical dimension of the shifter) and time. Also, in the disclosed technology a logic device may operate in pulsed regime. In some embodiments of the disclosed technology, the clocking scheme may be less complex because only rectangular types of pulses may be required. Moreover, the mechanisms for phase shifting are less complex than those needed to change the phase of the wave at the inputs, or to generate spin wave packets.

The phase shifters 130 may be configured to change the phase of the passing spin wave by an angle of $\pi$ radians.

In some embodiments of the disclosed technology, the at least two phase shifters 130 may include an input port. A phase shifter 130 may be configured to change the phase of the passing spin wave by changing an internal magnetic field in the waveguide 120 when a voltage is applied to the phase shifter 130. One or more of the phase shifters 130 are configured to locally change a magnetic field in the waveguide 120.

The underlying mechanism for the modulation of the internal field can, for example, be based on the voltage controlled magnetic anisotropy effect or on the magneto-electric effect. The amplitude of the spin waves will remain nearly unchanged. The phase difference at the output port will be given by the sum (majority) of the phase difference introduced by each input port upon its activation or not.

It is an advantage of embodiments of the disclosed technology that the spin wave is allowed to propagate in the waveguide for the next logic operations. Corrections for the phase accumulation may be achieved by the device design (for example by adjustments of the propagation lengths and distances between DC inputs).

It is an advantage of embodiments of the disclosed technology that such a scheme enables the logic gate cascading without the need of additional elements for signal normalization, thus simplifying the circuit including a potential reduction of the consumed power.

This concept may require less microwave circuitry compared to other concepts for which each input is based on a phase-controlled RF generator.

In some embodiments of the disclosed technology, the logic device includes a spin wave detector connected with the output port 140. The spin wave detector may, for example, be a magneto-electric cell configured to detect spin waves. The spin wave detector may, for example, be a magnetic tunnel junction configured to detect spin waves by measuring a tunneling magneto-resistance.

In some embodiments of the disclosed technology, the device includes exactly two phase shifters 130, thus forming a XOR gate with two inputs. Obtaining such an XOR gate with an interference-based logic device would result in a more complex circuit.

A XOR gate according to embodiments of the disclosed technology may include a plurality of phase shifters (for example, more than 2 inputs). The output of a XOR gate is true if the number of true inputs is odd, and false if the number of true inputs is even.

In some embodiments of the disclosed technology, the spin wave generator may be configured to generate spin waves with a fixed phase or the spin wave generator may be configured such that the generated spin wave can be modulated itself.

If the spin wave generator generates spin waves with fixed phase, one would need three phase shifters for a 3-input XOR gate.

Figure 2:
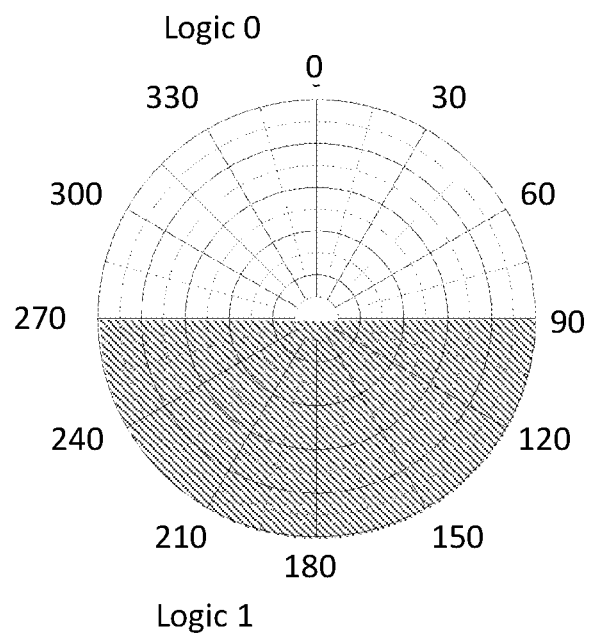
FIG. 2 shows a phase diagram of a XOR gate, in accordance with embodiments of the disclosed technology.

If the phase of the generated spin wave can be modulated itself, only 2 phase shifters would be needed for forming a 3-input XOR gate. In that case, the generator itself is the third input. For example, a 3-input XOR gate can be formed using a logic device in accordance with embodiments of the disclosed technology by an inline configuration of a spin wave generator, a waveguide, two phase shifters and an output port. A XOR gate is more difficult to achieve with a spin wave interference device. FIG. 2 shows a phase diagram of a XOR gate and of a 3-input XOR gate, in accordance with embodiments of the disclosed technology. The truth table of a XOR gate with two inputs is as follows:

| Inputs | | Outputs | Phase |
|---|---|---|---|
| 0 | 0 | 0 | 0° |
| 0 | 1 | 1 | 180° |
| 1 | 0 | 1 | 180° |
| 1 | 1 | 0 | 0° |

The truth table of a XOR gate with 3 inputs is as follows:
Inputs Outputs Phase

| Inputs | | | Outputs | Phase |
|---|---|---|---|---|
| 0 | 0 | 0 | 0 | 0° |
| 0 | 0 | 1 | 1 | 180° |
| 0 | 1 | 0 | 1 | 180° |
| 0 | 1 | 1 | 0 | 0° |
| 1 | 0 | 0 | 1 | 180° |
| 1 | 0 | 1 | 0 | 0° |
| 1 | 1 | 0 | 0 | 0° |
| 1 | 1 | 1 | 1 | 180° |

The phase logic for the input coding in this example is as follows: zero corresponds with a phase shift of 0°, 1 corresponds with a phase shift of 180°.

As will be elaborated further in the description, logic devices according to embodiments of the disclosed technology may be combined with logic devices based on spin wave interference.

Figure 3:
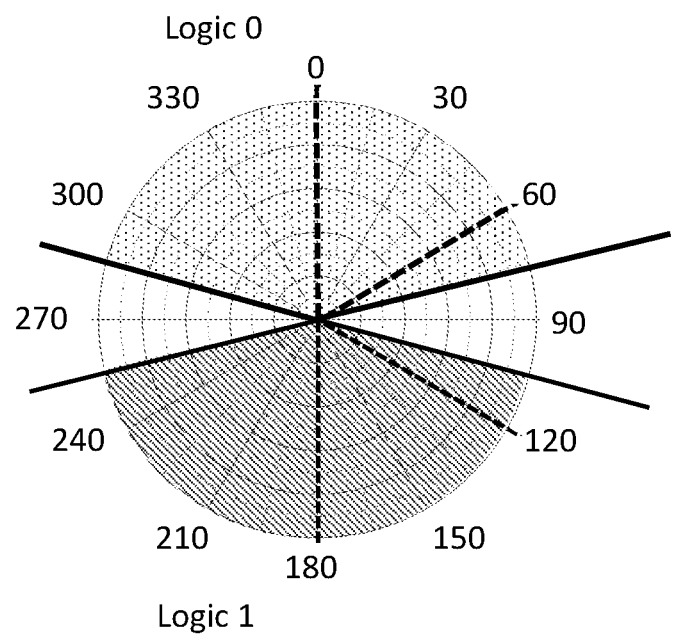
FIG. 3 shows a phase diagram of a spin wave majority gate.

FIG. 3 shows a phase diagram of a spin wave majority gate which may be combined with a logic device in accordance with embodiments of the disclosed technology. The truth table of such a majority gate is as follows:

| Inputs | | | Outputs | Phase |
|---|---|---|---|---|
| 0 | 0 | 0 | 0 | 0° |
| 1 | 0 | 0 | 0 | 60° |

-continued

| Inputs | | | Outputs | Phase |
|---|---|---|---|---|
| 0 | 1 | 0 | 0 | 60° |
| 0 | 0 | 1 | 0 | 60° |
| 1 | 1 | 0 | 1 | 120° |
| 1 | 0 | 1 | 1 | 120° |
| 0 | 1 | 1 | 1 | 120° |
| 1 | 1 | 1 | 1 | 180° |

The phase logic for the input coding may be as follows: zero corresponds with a phase 0°, 1 corresponds with a phase of 60°.

The phase logic for the readout may be as follows: from −75° to 75° corresponds with a logic 0, from 105° to 255° corresponds with a logic 1.

In some embodiments of the disclosed technology, the waveguide may be magnetostrictive. If the waveguide is magnetostrictive then the magnetization can be controlled directly by strain via the magnetoelectric effect. Otherwise, a magnetostrictive layer may be needed for magnetoelectric phase shifters.

Phase shifters of logic devices in accordance with embodiments of the disclosed technology may also be based on voltage-controlled magnetic anisotropy (VCMA) or on spin transfer toque (STT). Such phase shifters may not require magnetostrictive waveguides.

In some embodiments of the disclosed technology, the spin wave generator is a magnetoelectric transducer. Such a transducer may include a piezoelectric element that generates a magnetic response (for example, a spin wave) in a magnetostrictive waveguide by strain. If the waveguide itself is magnetostrictive, the magnetic response (the spin wave) is directly generated in the waveguide. If the waveguide is only weakly or not magnetostrictive, the logic device can include an additional magnetostrictive layer/element which is added in between the waveguide and the piezoelectric element. The piezoelectric element then generates some magnetization dynamics in the magnetostrictive element. The dynamics then couple to the ferromagnetic waveguide either by exchange or dipolar interactions. As can be understood the latter mechanism is more complex than the former.

In a second aspect, embodiments of the disclosed technology relate to a spintronic circuit including at least two logic devices, of which at least one is a logic device 100 according to embodiments of the disclosed technology. In some embodiments, an output at the output port of one logic device may be combined with an output at the output port of another logic device. In other embodiments, one logic device may be used as spin wave generator for the other logic device.

Figure 4:
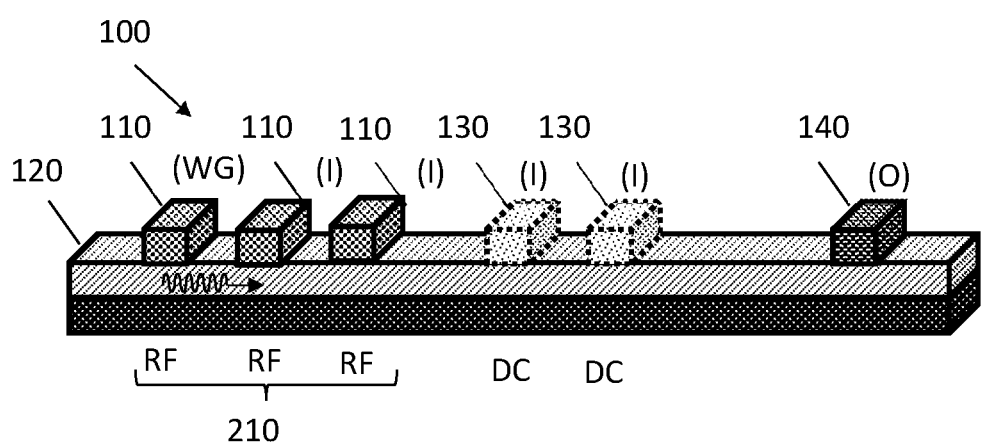
FIG. 4 shows a schematic drawing of a logic device including an RF majority gate and a XOR gate, in accordance with embodiments of the disclosed technology.

A spintronic circuit according to embodiments of the disclosed technology may include at least one logic device based on spin wave interference, which is interconnected with at least one logic device 100 according to embodiments of the disclosed technology. Logic devices according to embodiments of the disclosed technology may, for example, be combined with other spin wave-based logic devices, such as majority gate devices. An example is illustrated in FIG. 4, which shows an RF majority gate 210, including a plurality of spin wave generators 110, inline with a XOR gate including phase shifters 130.

Thus, a spintronic circuit according to embodiment of the disclosed technology may be obtained which includes both logic devices including phase shifters, and spin wave interference devices.

For a full adder, both a three-terminal XOR and a 3-input majority operation may be needed. The XOR may be implemented using a logic device in accordance with embodiments of the disclosed technology and the majority operation may be implemented using a spin wave interference device. This illustrates the complementarity of both approaches.

A spintronic circuit according to embodiments of the disclosed technology may include a clocking system which triggers the emission of a spin wave. The emitted spin wave propagates over the waveguide and, depending on the input of the phase shifters it is or is not phase shifted when passing by the phase shifters. The clocking system may trigger the phase shifters synchronous with the passage of the spin waves, such that they are, or are not, phase shifted, to control execution of logic functions. If a spin wave detector is connected with the output port, the clocking system may be connected with the spin wave detector for clocking the spin wave detector synchronous with the arrival of the spin waves.

In some embodiments of the disclosed technology, a constant voltage may be applied during a clocking cycle (or pulsed regime). The clocking scheme for a spintronic circuit which only includes logic devices according to embodiments of the disclosed technology is simplified compared to other concepts based on both continuous wave and pulsed regime operation. The proposed circuit simplification and operation scheme allow for a further reduction in the operation delays.

It is an advantage of embodiments of the disclosed technology that the proposed scheme is compatible with pipelining. In such a scheme, different spin wave pulses propagate in the waveguide. Pipelining means here that additional pulses may be launched before the first pulse has arrived at the output. Therefore, different computations can be performed sequentially in the waveguide faster than the propagation time to the output, which increases the computational speed.

It is an advantage of embodiments of the disclosed technology that the proposed scheme allows for frequency division multiplexing. In frequency multiplexing, spin waves with different frequency pass through the waveguide at the same time. The detector separates the spin waves according to their wavelength and detects the outcomes of the different computations (one per wavelength). A single phase shifter may manipulate waves with different frequencies independently or a phase shifter may be included per used wavelength and input. In the latter case, the design can permit that the effect on waves with other non-selected wavelengths is negligible.

Figure 5:
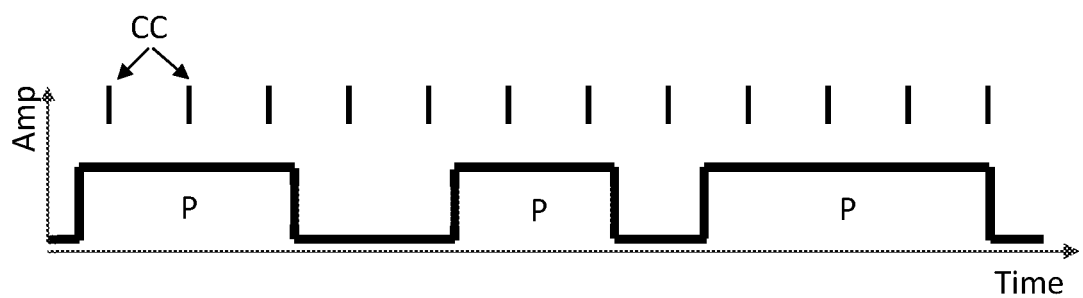
FIG. 5 shows a sequence of clock cycles and spin wave pulses as a function of time.

It is an advantage of embodiments of the disclosed technology that the phase shifters are pseudo DC controlled. When a phase shifter is pseudo DC controlled, this means that the voltage is constant during one or more clocking cycles. This is illustrated in FIG. 5, which shows a series of clock cycles (CC) and spin wave pulses (P) as a function of time. The amplitude of the spin waves is shown as a function of time. In the example, spin wave pulses with different pulse durations are shown. Having (pseudo) DC controlled logic devices is particularly advantageous compared to solutions where the logic device is a majority gate device based on constructive and destructive interference of spin waves. In such devices, multiple RF input sources may be needed, using complex input signals with GHz carrier frequencies. In contrast, in the disclosed technology, one spin wave generator with an RF input source is sufficient.

Interference-based spin wave devices in the pulsed regime, in some embodiments, can operate with complex pulse shapes with, for example, wave packets with a GHz carrier frequency and a Gaussian envelope.

In phase shifters of a logic device in accordance with embodiments of the disclosed technology, on the contrary, rectangular voltage pulses are fully adequate.

In practice, as explained before, spin wave interference devices and logic devices based on phase shifters, in accordance with embodiments of the disclosed technology, may coexist. Some computations may be done with interference, some with phase shifting. Phase shifting is simpler but interference may be needed for some part of the circuit.

In a third aspect, embodiments of the disclosed technology relate to a toolbox for creating a spintronic circuit, the toolbox including at least a building block for creating a logic device according to embodiments of the disclosed technology.

In some embodiments of the disclosed technology, the toolbox may, moreover, include a building block for creating a spin wave interference devices. It is an advantage of embodiments of the disclosed technology that a toolbox for designing spintronic circuits includes the different approaches. Such a toolbox may, for example, contain RF majority gates (as well as other types of gates NAND, NOR, XOR, etc.) of different shapes, inverters, directional couplers for the spin wave amplitude normalization, spin waves interconnects, splitters and combiners, spin wave amplifiers and repeaters.

While various embodiments of the disclosed technology have been described above, it should be understood that they have been presented by way of example only, and not limitation. Numerous changes to the disclosed embodiments can be made in accordance with the disclosure herein without departing from the spirit or scope of the disclosed technology. Thus, the breadth and scope of the disclosed technology should not be limited by any of the above-described embodiments.

What is claimed is:

1. A logic device based on spin waves, the logic device comprising:
    a spin wave generator, a waveguide, at least two phase shifters, and an output port,
    wherein the spin wave generator is connected with the waveguide and is configured to emit a spin wave in the waveguide,
    wherein the at least two phase shifters are connected with the waveguide at separate positions such that, when a spin wave is emitted by the spin wave generator, the spin wave passes via the at least two phase shifters, wherein the at least two phase shifters are configured to change a phase of the passing spin wave, wherein a phase shifter of the at least two phase shifters is configured to change the phase of the passing spin wave by changing an internal magnetic field in the waveguide when a voltage is applied to an input port of the phase shifter,
    wherein the output port is connected with the waveguide such that the at least two phase shifters are present between the spin wave generator and the output port, and
    wherein the amplitude of the spin wave remains approximately unchanged when passing via the at least two phase shifters.

2. The logic device according to claim 1, wherein one or more of the at least two phase shifters are configured to locally change a magnetic field in the waveguide.

3. The logic device according to claim 2, wherein one or more of the at least two phase shifters are based on a voltage controlled magnetic anisotropy effect.

4. The logic device according to claim 2, wherein one or more of the at least two phase shifters are based on a magnetoelectric effect.

5. The logic device according to claim 1, wherein the at least two phase shifters are configured to change the phase of the passing spin wave by an angle of 7 radians.

6. The logic device according to claim 1, wherein the spin wave generator is a magneto-electric cell configured to generate a spin wave by a spin torque effect.

7. The logic device according to claim 6, wherein the spin wave generator is a magnetic tunnel junction configured to generate a spin wave by a spin torque effect.

8. The logic device according to claim 1, the logic device comprising a spin wave detector connected with the output port.

9. The logic device according to claim 8, wherein the spin wave detector is a magneto-electric cell configured to detect spin waves.

10. The logic device according to claim 9, wherein the spin wave detector is a magnetic tunnel junction configured to detect spin waves by measuring a tunneling magneto-resistance.

11. The logic device according to claim 1, the device comprising exactly two phase shifters, the logic device forming a XOR gate.

12. The logic device according to claim 1, wherein the waveguide is magnetostrictive.

13. The logic device according to claim 1, wherein the waveguide is ferromagnetic.

14. A spintronic circuit comprising at least two logic devices, of which at least one is a logic device according to claim 1, wherein an output at the output port of one logic device is combined with an output at the output port of another logic device.

15. A spintronic circuit comprising at least two logic devices, of which at least one is a logic device according to claim 1, wherein one logic device is used as a spin wave generator for another logic device.

16. A toolbox for creating a spintronic circuit, the toolbox comprising a building block for creating a logic device according to claim 1.

* * * * *

UNITED STATES PATENT AND TRADEMARK OFFICE
CERTIFICATE OF CORRECTION

| | | |
|---|---|---|
| PATENT NO. | : 12,125,623 B2 | Page 1 of 1 |
| APPLICATION NO. | : 17/804550 | |
| DATED | : October 22, 2024 | |
| INVENTOR(S) | : Florin Ciubotaru et al. | |

It is certified that error appears in the above-identified patent and that said Letters Patent is hereby corrected as shown below:

In the Specification

Column 4, Line 64, delete "and 1800 may" and insert -- and 180° may --.

Column 5, Line 29, delete "of Πradians." and insert -- of Π radians. --.

Column 6, Line 38 (approx.), delete "follows: Inputs Outputs Phase" and insert -- follows: --.

In the Claims

Column 10, Claim 5, Line 20, delete "of 7 radians." and insert -- of Π radians. --.

Signed and Sealed this
Seventh Day of January, 2025

Derrick Brent
*Acting Director of the United States Patent and Trademark Office*